(12) United States Patent
Park et al.

(10) Patent No.: US 11,948,814 B2
(45) Date of Patent: Apr. 2, 2024

(54) VALVE STRUCTURE AND SUBSTRATE PROCESSING APPARATUS INCLUDING THE SAME

(71) Applicant: Samsung Electronics Co., Ltd., Suwon-si (KR)

(72) Inventors: Kangmin Park, Yongin-si (KR); Hyungho Kim, Hwaseong-si (KR); Dongwoo Wi, Hwaseong-si (KR); Hyunsoo Chun, Suwon-si (KR); Jiho Uh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 184 days.

(21) Appl. No.: 17/747,270

(22) Filed: May 18, 2022

(65) Prior Publication Data

US 2023/0130512 A1 Apr. 27, 2023

(30) Foreign Application Priority Data

Oct. 26, 2021 (KR) ........................ 10-2021-0144013

(51) Int. Cl.
*H01L 21/67* (2006.01)
*F16K 3/18* (2006.01)
(Continued)

(52) U.S. Cl.
CPC ........ *H01L 21/67126* (2013.01); *F16K 51/02* (2013.01); *H01L 21/67017* (2013.01);
(Continued)

(58) Field of Classification Search
CPC . F16K 51/02; F16K 3/18; F16K 3/182; F16K 3/0281; F16K 3/314;
(Continued)

(56) References Cited

U.S. PATENT DOCUMENTS 4,560,141 A * 12/1985 Bosch ...................... F16K 3/182
251/169
5,026,995 A * 6/1991 Hazaki ...................... F16K 3/186
250/442.11
(Continued)

FOREIGN PATENT DOCUMENTS

JP 6150388 B2 6/2017
KR 100596332 B1 7/2006
(Continued)

*Primary Examiner* — David Colon-Morales
(74) *Attorney, Agent, or Firm* — Muir Patent Law, PLLC (57) ABSTRACT

A process chamber door for closing or opening an entrance of a process chamber through which a substrate to be process is loaded includes a seal plate including a front surface and a rear surface opposite to each other in a first direction, a connection block connected to the rear surface of the seal plate and including a central portion and two side portions connected to the rear surface of the seal plate, and a shaft connected to the central portion of the connection block. The connection block includes a first hinge groove and a second hinge groove. The first hinge groove is exposed at a bottom surface and a side surface of the connection block and the second hinge groove is exposed at an upper surface and the side surface of the connection block.

20 Claims, 8 Drawing Sheets

(51) Int. Cl.
*F16K 3/314* (2006.01)
*F16K 51/02* (2006.01)
*H01L 21/677* (2006.01)
*F16K 3/02* (2006.01)

(52) U.S. Cl.
CPC ...... *H01L 21/67739* (2013.01); *F16K 3/0281* (2013.01); *F16K 3/18* (2013.01); *F16K 3/314* (2013.01)

(58) Field of Classification Search
CPC ......... H01L 21/67126; H01L 21/67739; H01L 21/67017
See application file for complete search history.

(56) References Cited

U.S. PATENT DOCUMENTS

| | | | | |
|---|---|---|---|---|
| 5,170,990 A * | 12/1992 | Kamiya | ................. | F16K 51/02 251/210 |
| 5,769,952 A * | 6/1998 | Komino | ................. | F16K 51/02 118/733 |
| 6,471,181 B2 | 10/2002 | Duelli | | |
| 7,134,642 B2 | 11/2006 | Seitz | | |
| 7,980,529 B2 * | 7/2011 | Seitz | ....................... | F16K 51/02 251/193 |
| 8,534,311 B2 * | 9/2013 | Ishigaki | ................. | F16K 3/3165 137/341 |
| 8,678,344 B2 * | 3/2014 | Ehrne | ..................... | F16K 3/314 251/87 |
| 8,827,241 B2 * | 9/2014 | Geiser | ..................... | F16K 3/188 251/193 |
| 9,121,515 B2 * | 9/2015 | Yamamoto | ........ | H01L 21/67126 |
| 10,184,291 B2 * | 1/2019 | Blecha | ...................... | E06B 5/10 |
| 10,443,741 B2 * | 10/2019 | Kim | ...................... | F16K 31/122 |
| 10,746,307 B2 * | 8/2020 | Nagai | .................... | F16K 27/044 |
| 10,876,637 B2 * | 12/2020 | Blecha | ................... | F16K 51/02 |
| 11,415,230 B2 * | 8/2022 | Wirth | ................... | F16K 31/124 |
| 11,668,401 B2 * | 6/2023 | Shimoda | ................. | F16K 3/18 251/326 |
| 11,702,740 B2 | 7/2023 | Kollberg | ............. | H01L 21/6719 118/733 |
| 2016/0363240 A1 * | 12/2016 | Wagner | ................. | B01D 39/08 |

FOREIGN PATENT DOCUMENTS

| | | | |
|---|---|---|---|
| KR | 100960030 B1 | 5/2010 | |
| KR | 101407656 B1 | 6/2014 | |
| KR | 101568454 B1 | 11/2015 | |
| KR | 101918512 B1 | 11/2018 | |
| KR | 20230001598 A | * | 1/2023 |

* cited by examiner

VALVE STRUCTURE AND SUBSTRATE PROCESSING APPARATUS INCLUDING THE SAME

CROSS-REFERENCE TO RELATED APPLICATION

This application is based on and claims priority under 35 U.S.C. § 119 to Korean Patent Application No. 10-2021-0144013, filed on Oct. 26, 2021, in the Korean Intellectual Property Office, the disclosure of which is incorporated by reference herein in its entirety.

BACKGROUND

The inventive concept relates to a valve structure and a substrate processing apparatus including the same.

In general, a substrate processing apparatus may include a processing chamber configured to process a substrate, such as a semiconductor wafer, and a valve structure configured to open or close an opening or passage of the processing chamber into and from which the substrate is loaded and unloaded. The valve structure may maintain a vacuum level of the inside of the processing chamber at a predetermined level by closing the opening of the processing chamber.

SUMMARY

The inventive concept provides a valve structure having improved reliability and a substrate processing apparatus including the valve structure.

According to an aspect of the inventive concept, a process chamber door for closing or opening an entrance of a process chamber through which a substrate to be processed is loaded includes a seal plate including a front surface and a rear surface opposite to each other in a first direction, a connection block connected to the rear surface of the seal plate, the connection block including a central portion and two side portions connected to the rear surface of the seal plate, and a shaft connected to the central portion of the connection block. The connection block further includes a first hinge groove disposed at a bottom surface and a side surface of each of the two side portions of the connection block, the first hinge groove extending in a second direction and a third direction in the connection block, the second direction being perpendicular to the first direction, and the third direction being perpendicular to the first direction and the second direction, and a second hinge groove disposed at an upper surface and the side surface of each of the two side portions of the connection block. The second hinge groove extends in the second direction and the third direction.

According to an aspect of the inventive concept, a process chamber door for closing or opening an entrance of a process chamber through which a substrate to be processed is loaded includes a seal plate including a front surface and a rear surface opposite to each other in a first direction, a connection block connected to the rear surface of the seal plate, the connection block including a central portion and two side portions connected to the rear surface of the seal plate, and a shaft connected to the central portion of the connection block and moved by an actuator. The connection block further includes a first hinge groove disposed at a bottom surface and a side surface of each of the two side portions of the connection block, the first hinge groove extending in a second direction and a third direction in the connection block and the second direction being perpendicular to the first direction and the third direction being perpendicular to the first direction and the second direction, a second hinge groove disposed at an upper surface and the side surface of each of the two side portions of the connection block, the second hinge groove extending in the second direction and the third direction in the connection block and being spaced apart from the first hinge groove in the third direction, a first front end portion and a first rear end portion being spaced apart from each other with the first hinge groove therebetween, and a second front end portion and a second rear end portion being spaced apart from each other with the second hinge groove therebetween. The first front end portion of the connection block is fastened to the seal plate by a first fastening bolt. The second front end portion of the connection block is fastened to the seal plate by a second fastening bolt.

According to an aspect of the inventive concept, a substrate processing apparatus includes a processing chamber including an entrance through which a substrate to be processed is loaded, and a process chamber door that opens or closes the entrance of the processing chamber. The process chamber door includes a seal plate including a front surface facing the processing chamber and a rear surface opposite to the front surface in a first lateral direction, a connection block connected to the rear surface of the seal plate, the connection block including a central portion and two side portions connected to the rear surface of the seal plate, and a shaft connected to the central portion of the connection block. The shaft is moved by an actuator in the first lateral direction and a vertical direction. The connection block further includes a first hinge groove disposed at a bottom surface and a side surface of the connection block, the first hinge groove extending in the vertical direction and a second lateral direction in the connection block and the second lateral direction being perpendicular to the first lateral direction, and a second hinge structure disposed at an upper surface and the side surface of the connection block. The second hinge structure extends in the vertical direction and the second lateral direction in the connection block.

According to an aspect of the inventive concept, a method of fabricating a device includes loading a substrate into a processing chamber through an entrance of the processing chamber, closing the entrance of the processing chamber by moving a process chamber door with a seal plate and a flexure hinge to a closing position, performing a processing process on the substrate, opening the entrance of the processing chamber by moving the process chamber door to an opening position, and unloading the substrate from the processing chamber through the entrance of the processing chamber.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings. The same reference numerals are used to denote the same elements in the drawings, and repeated descriptions thereof will be omitted.

Figure 1:
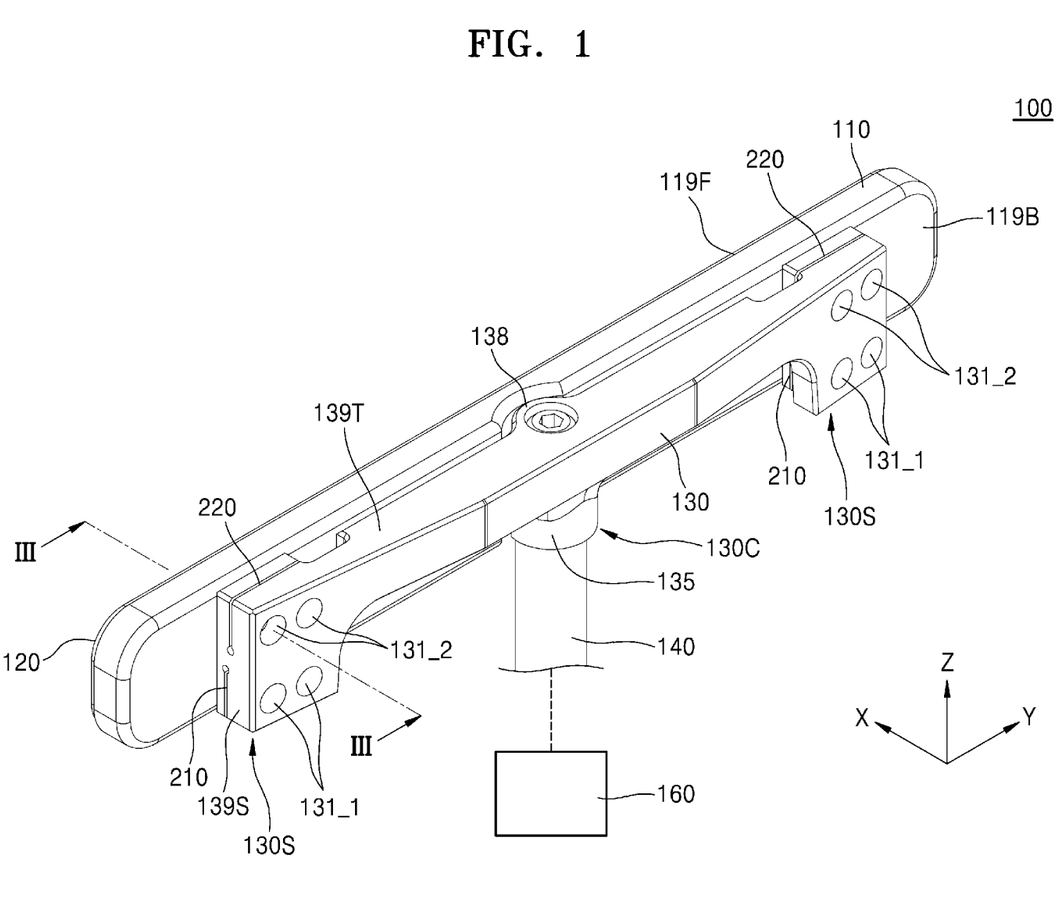
FIG. 1 is a perspective view of a valve structure according to example embodiments.
Figure 2:
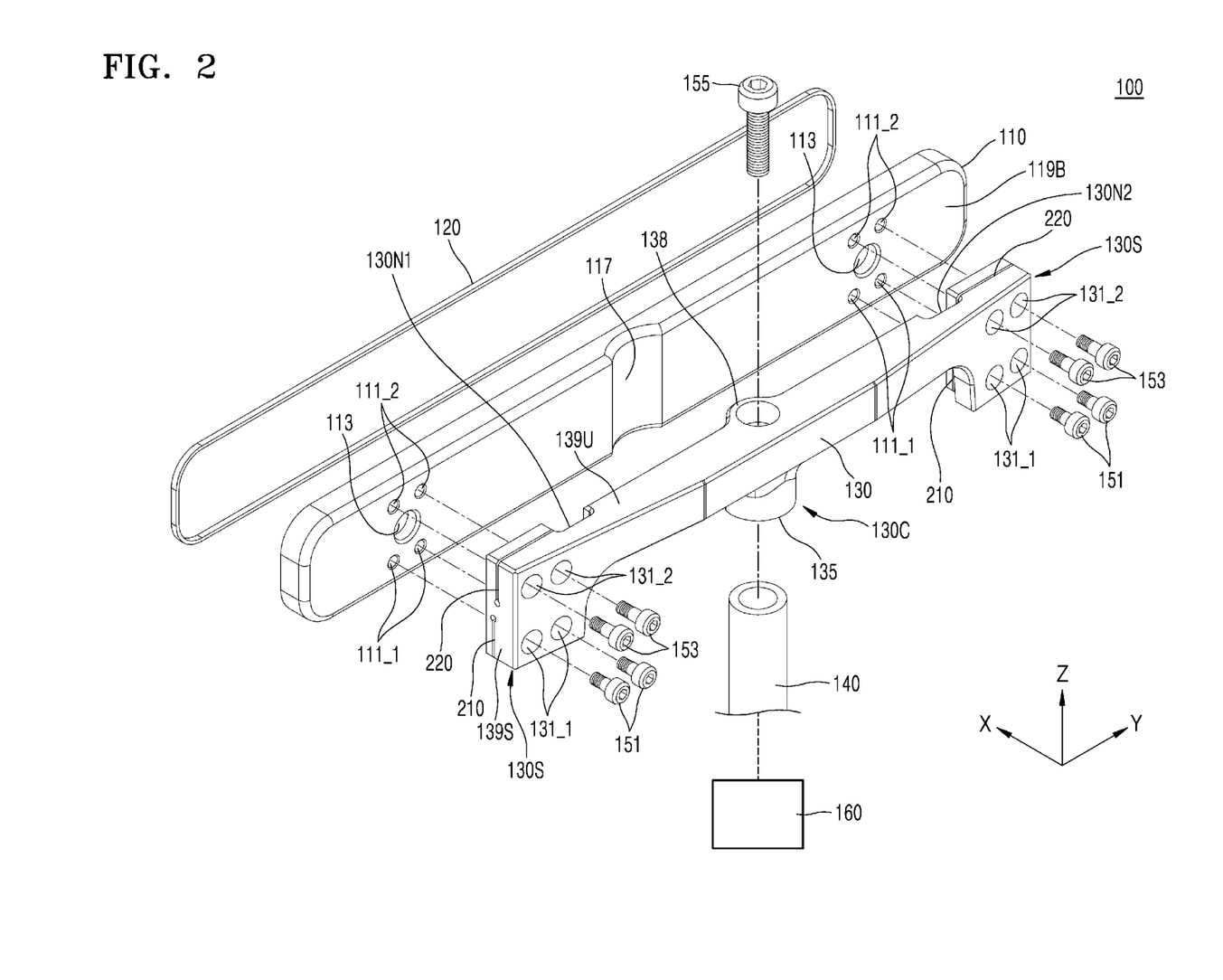
FIG. 2 is an exploded perspective view of the valve structure of FIG. 1.
Figure 3:
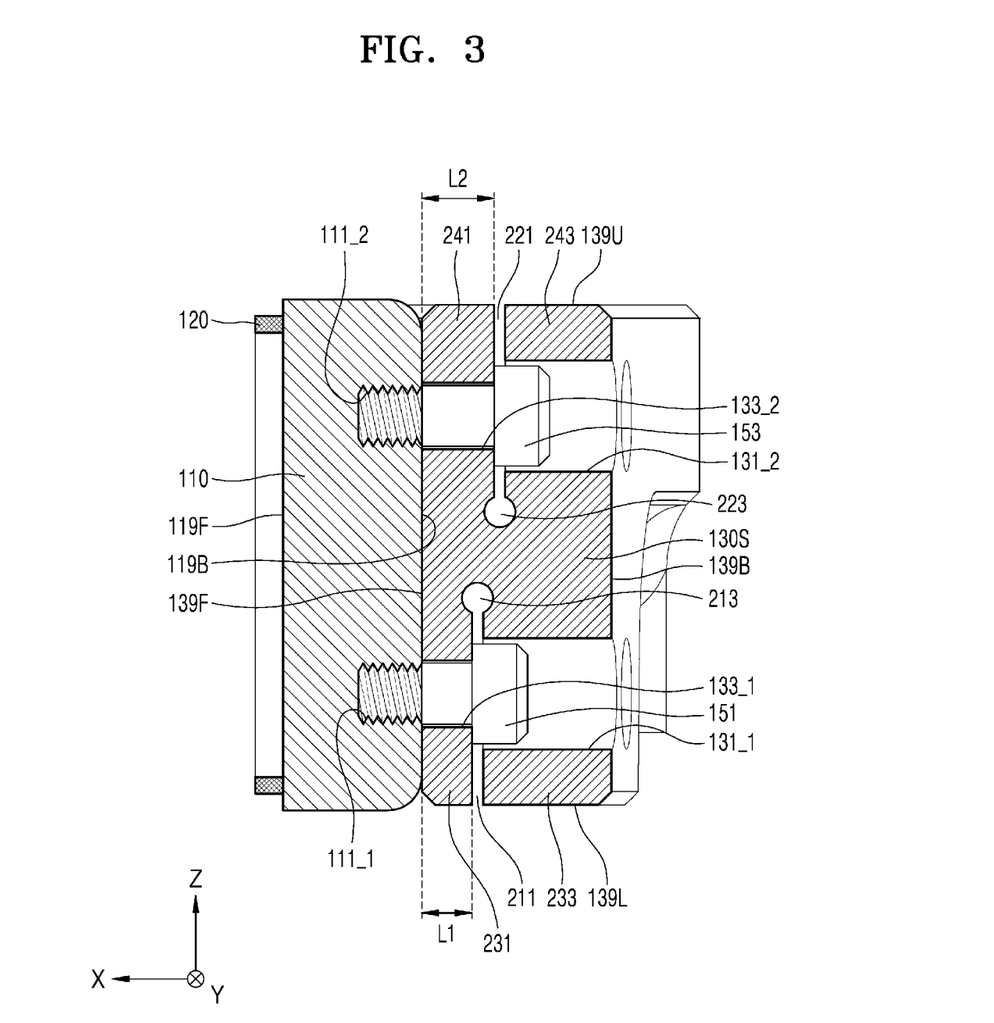
FIG. 3 is a cross-sectional view taken along line of FIG. 1.
Figure 4:
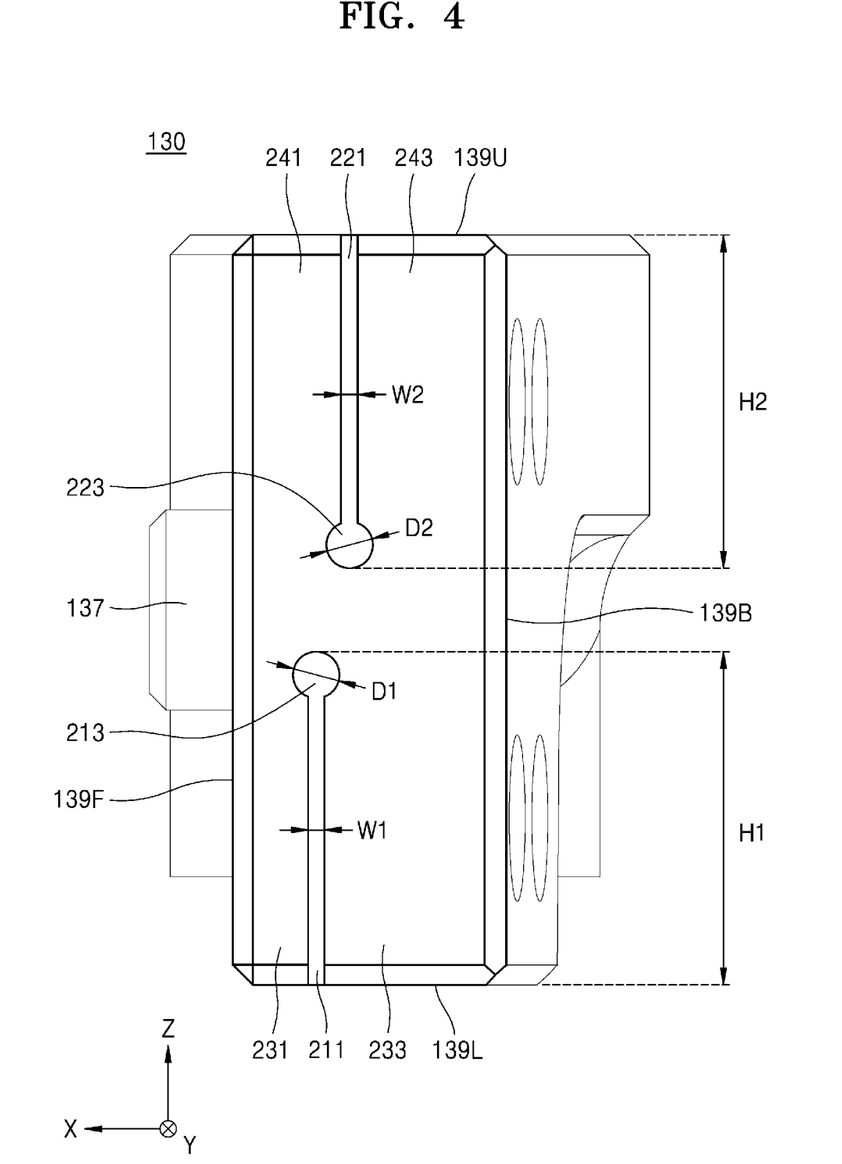
FIG. 4 is a lateral view of a connection block of the valve structure of FIG. 1.

FIG. 1 is a perspective view of a valve structure 100 according to example embodiments. FIG. 2 is an exploded perspective view of the valve structure 100 of FIG. 1. FIG. 3 is a cross-sectional view taken along line of FIG. 1. FIG. 4 is a lateral view of a connection block 130 of the valve structure 100 of FIG. 1.

Referring to FIGS. 1 to 4, the valve structure 100 (i.e., a process chamber door) may include a seal plate 110, a seal ring 120, a connection block 130, a shaft 140, and an actuator 160.

The valve structure 100 may open or close an opening (i.e., an entrance) (refer to 511 in FIG. 5) of a processing chamber (refer to 510 in FIG. 5) into and from which a substrate to be processed is loaded and unloaded. The opening 511 of the processing chamber 510 may have a slit shape so that a vertical height of the opening 511 (i.e., a length of the opening 511 in the vertical direction (e.g., Z direction)) may be smaller than a lateral width of the opening 511 (i.e., a length of the opening 511 in the second lateral direction (e.g., Y direction)). For example, to open or close the opening 511 of the processing chamber 510, the valve structure 100 may move the seal plate 110 between an opening position at which the opening 511 of the processing chamber 510 is opened and the closing position at which the opening 511 of the processing chamber 510 is closed.

The seal plate 110 may have a front surface 119F and a rear surface 119B, which are opposite to each other and have a substantially plate shape. The front surface 119F of the seal plate 110 may be a surface facing a wall surface of the processing chamber 510 having the opening 511 and may include a planar surface. Hereinafter, a first lateral direction (e.g., X direction) may be defined as a direction perpendicular to the front surface 119F of the seal plate 110, and a second lateral direction (e.g., Y direction) and a vertical direction (e.g., Z direction) may be defined as directions that are parallel to the front surface 119F of the seal plate 110 and perpendicular to each other. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

The seal plate 110 may have a rectangular shape when viewed in the first lateral direction (e.g., X direction). For example, the seal plate 110 may have a long side extending in the second lateral direction (e.g., Y direction) and a short side extending in the vertical direction (e.g., Z direction). A vertical height of the seal plate 110 (i.e., a length of the seal plate 110 in the vertical direction (e.g., Z direction)) may be greater than the vertical height of the opening 511 of the processing chamber 510 and a lateral width of the seal plate 110 (i.e., a length of the seal plate 110 in the second lateral direction (e.g., Y direction)) may be greater than the lateral width of the opening 511 of the processing chamber 510 so that the seal plate 110 may close the opening 511 of the processing chamber 510.

In example embodiments, the seal plate 110 may include or may be formed of aluminum (Al) or an aluminum alloy.

The seal ring 120 may be adhered to the front surface 119F of the seal plate 110. The seal ring 120 may have a ring shape that continuously extends along the circumference of the front surface 119F of the seal plate 110. For example, the seal ring 120 may be adhered to the front surface 119F of the seal plate 110 by using an adhesive member or fitted into a mounting groove provided at the front surface 119F of the seal plate 110. The seal ring 120 may include or may be formed of an elastic material such as rubber. The seal ring 120 may strengthen sealing force between the seal plate 110 and the wall surface of the processing chamber 510.

The connection block 130 may be connected to the rear surface 119B of the seal plate 110. The connection block 130 may be directly coupled to the shaft 140, which is moved by the actuator 160. A driving force generated by the actuator 160 may be transmitted to the seal plate 110 through the shaft 160. For example, the actuator 160 may transmit a driving force to the connection block 130 via the shaft 160, and the transmitted force may be uniformly applied to the seal plate 110 via a flexure hinge structure (i.e., a flexure hinge) of the connection block 130. The flexure hinge structure will be described later.

When viewed in the first lateral direction (e.g., X direction), the connection block 130 may have a rectangular shape such that a length of the connection block 130 in the second lateral direction (e.g., Y direction) is greater than a length of the connection block 130 in the vertical direction (e.g., Z direction). The connection block 130 may include a central portion 130C and two side portions 130S, which are spaced apart from each other with the central portion 130C therebetween. In an embodiment, the central portion 130C may be distinguished from the two side portions 130S by first and second notches 130N1 and 130N2, respectively. For example, one of the two side portions 130S, the left to the central portion 130C, may be distinguished from the central portion 130C by the first notch 130N1, and the other of the two side portions 130S, the right to the central portion 130C, may be distinguished from the central portion 130C by the second notch 130N2. The first and second notches 130N1 and 130N2 may be regions recessed from a front surface of the central block 130C, adjacent to the rear surface 119B of the seal plate 110, in the first lateral direction (e.g., X direction) away from the rear surface 119B of the seal plate 110. In an embodiment, each of the first and second notches 130N1 and 130N2 may be connected to the second hinge groove 220 of a corresponding side portion of the two side portions 130S. In an embodiment, each of the two side portions 130S may have a protruded portion extending downwardly beyond a bottom surface of the central portion 130C. In an embodiment, the first hinge groove 210 may extend along a bottom surface of the protruded portion in the second lateral direction (e.g., Y-axis). For example, the first hinge groove 210 may extend from a first end of the protruded portion to a second end of the protruded portion, and the first and second ends of the protruded portion may be spaced apart from each other in the second lateral direction (e.g., Y-axis). The connection block 130 may have a symmetrical shape with respect to the central portion 130C. For instance, the two side portions 130S of the connection block 130 may correspond to one end portion (or a left end portion) and another end portion (or a right end portion) of the connection block 130 in the second lateral direction (e.g., Y direction). The two side portions 130S of the connection block 130 may be fastened to the seal plate 110 through fastening bolts, and front surfaces of the two side portions 130S of the connection block 130 may be in contact with the rear surface 119B of the seal plate 110. The central portion 130C of the connection block 130 may be spaced apart from the rear surface 119B of the seal plate 110 in the first lateral direction (e.g., X direction) such that a gap is formed between the central portion 130C of the connection block 130 and the rear surface 119B of the seal plate 110. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The central portion 130C of the connection block 130 may be coupled to the shaft 140. The shaft 140 may be a rod that extends in the vertical direction (e.g., Z direction). The shaft 140 may be inserted into a shaft insertion hole 135 provided at the central portion 130C of the connection block 130. For example, a third fastening bolt 155 inserted into the connection block 130 from an upper side of the connection block 130 may be fastened to the shaft 140 inserted into the connection block 130 from a lower side of the central portion 130C of the connection block 130, and thus, the shaft 140 may be fixed to the connection block 130 using the third fastening bolt 155. A concave portion 117 may be provided at a central portion of the rear surface 119B of the seal plate 110, and the central portion 130C of the connection block 130 may include a convex portion 138, which is accommodated in the concave portion 117 of the seal plate 110. In a view from above, the concave portion 117 of the rear surface 119B of the seal plate 110 may include a concave surface, while the convex portion 138 of the connection block 130 may include a convex surface facing the concave surface of the concave portion 117 of the seal plate 110.

The connection block 130 may include a flexure hinge structure. The flexure hinge structure may be defined as a structure in which elastic deformation in a specific direction due to external force applied from the outside is relatively small and elastic deformation in other directions due to the external force is relatively large. In an embodiment, the flexure hinge may be a device which connects two components and transmits a force between two components while allowing limited relative movement between such two components by deflecting elastically. For example, the actuator 160 may transmit a driving force to the connection block 130 via the shaft 160, and the transmitted force may be uniformly applied to the seal plate 110 via a flexure hinge structure (i.e., a flexure hinge) of the connection block 130. The flexure hinge structure will be described later.

In example embodiments, when external force is applied from the outside, the connection block 130 may provide relatively large elastic deformation (or restoring force) in the first lateral direction (e.g., X direction) and provide relatively small elastic deformation (or restoring force) in the second lateral direction (e.g., Y direction) and the vertical direction (e.g., Z direction). In example embodiments, the connection block 130 may include or may be formed of aluminum or an aluminum alloy.

In example embodiments, each of the two side portions 130S of the connection block 130 may include a first hinge groove 210 and a second hinge groove 220. The flexure hinge structure of the connection block 130 may be embodied by at least one of the first hinge groove 210 and the second hinge groove 220.

The first hinge groove 210 may be provided at the connection block 130 and exposed at a side surface 139S and a bottom surface 139L of the connection block 130. The first hinge groove 210 may be substantially parallel to the front surface 119F of the seal plate 110. For example, the first hinge groove 210 may extend in a direction substantially parallel to the front surface 119F of the seal plate 110. When viewed in the first lateral direction (e.g., X direction), the first hinge groove 210 may have a tetragonal shape. The first hinge groove 210 may be spaced apart from the rear surface 119B of the seal plate 110 by a first distance L1 and extend in the second lateral direction (e.g., Y direction) and the vertical direction (e.g., Z direction) in the connection block 130. A lateral width W1 of the first hinge groove 210 in the first lateral direction (e.g., X direction) may be less than the extension length of the first hinge groove 210 in the second lateral direction (e.g., Y direction) and an extension length H1 of the first hinge groove 210 in the vertical direction (e.g., Z direction). The lateral width W1 of the first hinge groove 210 in the first lateral direction (e.g., X direction) may correspond to a lateral width of a first lower groove 211 of the first hinge groove 210 in the first lateral direction (e.g., X direction), which will be described below. In example embodiments, the lateral width W1 of the first hinge groove 210 in the first lateral direction (e.g., X direction) may be in a range of about 0.5 mm to about 3 mm or in a range of about 0.7 mm to about 2.5 mm. In example embodiments, the lateral width W1 of the first hinge groove 210 in the first lateral direction (e.g., X direction) may be about 1 mm.

In example embodiments, the extension length of the first hinge groove 210 in the second lateral direction (e.g., Y direction) may be in a range of about 15% to about 35% of a total lateral width of the connection block 130 in the second lateral direction (e.g., Y direction). In example embodiments, the extension length of the first hinge groove 210 in the second lateral direction (e.g., Y direction) may be in a range of about 20 mm to about 50 mm, in a range of about 25 mm to about 45 mm, or in a range of about 30 mm to about 40 mm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In example embodiments, the extension length H1 of the first hinge groove 210 in the vertical direction (e.g., Z direction) may be in a range of about 30% to about 50% of a total vertical height of the connection block 130 in the vertical direction (e.g., Z direction). In example embodiments, the extension length H1 of the first hinge groove 210 in the vertical direction (e.g., Z direction) may be in a range of about 10 mm to about 25 mm, in a range of about 12 mm to about 23 mm, or in a range of about 15 mm to about 20 mm.

In a side cross-sectional view, the first hinge groove 210 may include a first upper groove 213 having a circular shape and the first lower groove 211, which linearly extends downward from the first upper groove 213 to the bottom surface 139L of the connection block 130. The first lower groove 211 may have a uniform lateral width and extend in the vertical direction (e.g., Z direction). A diameter D1 of the first upper groove 213 may be greater than the lateral width W1 of the first lower groove 211 in the first lateral direction (e.g., X direction). For example, the diameter D1 of the first upper groove 213 may be in a range of about 150% to about 250% of the lateral width of the first lower groove 211 in the first lateral direction (e.g., X direction). Because the first upper groove 213 at an end portion of the first hinge groove 210 has a circular cross-section, stress concentration may be alleviated at the end portion of the first hinge groove 210.

The first hinge groove 210 may pass through the side portion 130S of the connection block 130 in the second lateral direction (e.g., Y direction). For example, one side end portion and another side end portion of the first hinge groove 210 in the second lateral direction (e.g., Y direction) may be exposed to the outside of the connection block 130. The side portion 130S of the connection block 130 may include a first front end portion 231 and a first rear end portion 233, which are spaced apart from each other in the first lateral direction (e.g., X direction) with the first hinge groove 210 therebetween. The first hinge groove 210 may be defined as a gap between the first front end portion 231 and the first rear end portion 233 of the connection block 130.

The second hinge groove 220 may be provided at the connection block 130 and exposed at the side surface 139S and an upper surface 139U of the connection block 130. The second hinge groove 220 may be substantially parallel to the front surface 119F of the seal plate 110. For example, the second hinge groove 220 may extend in a direction substantially parallel to the front surface 119F of the seal plate 110. When viewed in the first lateral direction (e.g., X direction), the second hinge groove 220 may have a tetragonal shape. The second hinge groove 220 may be spaced apart from the rear surface 119B of the seal plate 110 by a second distance L2 and extend in the second lateral direction (e.g., Y direction) and the vertical direction (e.g., Z direction) in the connection block 130. A lateral width W2 of the second hinge groove 220 in the first lateral direction (e.g., X direction) may be less than the extension length of the second hinge groove 220 in the second lateral direction (e.g., Y direction) and the extension length H2 of the second hinge groove 220 in the vertical direction (e.g., Z direction). The lateral width W2 of the second hinge groove 220 in the first lateral direction (e.g., X direction) may correspond to a lateral width of a second upper groove 221 of the second hinge groove 220, which will be described below, in the first lateral direction (e.g., X direction).

In example embodiments, each of the first distance L1 between the first hinge groove 210 and the rear surface 119B of the seal plate 110 and the second distance L2 between the second hinge groove 220 and the rear surface 119B of the seal plate 110 may be in a range of about 2 mm to about 20 mm.

In example embodiments, the first distance L1 between the first hinge groove 210 and the rear surface 119B of the seal plate 110 may be different from the second distance L2 between the second hinge groove 220 and the rear surface 119B of the seal plate 110. For instance, the first distance L1 between the first hinge groove 210 and the rear surface 119B of the seal plate 110 may be about 5 mm, while the second distance L2 between the second hinge groove 220 and the rear surface 119B of the seal plate 110 may be about 7 mm.

In example embodiments, the first distance L1 between the first hinge groove 210 and the rear surface 119B of the seal plate 110 may be equal to the second distance L2 between the second hinge groove 220 and the rear surface 119B of the seal plate 110. In this case, the first hinge groove 210 may be aligned with the second hinge groove 220 in the vertical direction (e.g., Z direction).

In example embodiments, dimensions of the second hinge groove 220 (e.g., the lateral width W2 of the second hinge groove 220 in the first lateral direction (e.g., X direction), the extension length of the second hinge groove 220 in the second lateral direction (e.g., Y direction), and the extension length H2 of the second hinge groove 220 in the vertical direction (e.g., Z direction)) may be substantially equal to dimensions of the first hinge groove 210, which correspond thereto. In example embodiments, dimensions of the second hinge groove 220 (e.g., the lateral width W2 of the second hinge groove 220 in the first lateral direction (e.g., X direction), the extension length of the second hinge groove 220 in the second lateral direction (e.g., Y direction), and the extension length H2 of the second hinge groove 220 in the vertical direction (e.g., Z direction)) may be different from dimensions of the first hinge groove 210, which correspond thereto.

In example embodiments, the lateral width W2 of the second hinge groove 220 in the first lateral direction (e.g., X direction) may be in a range of about 0.5 mm to about 3 mm or in a range of about 0.7 mm to about 2.5 mm. In example embodiments, the lateral width W2 of the second hinge groove 220 in the first lateral direction (e.g., X direction) may be about 1 mm.

In example embodiments, the extension length of the second hinge groove 220 in the second lateral direction (e.g., Y direction) may be in a range of about 15% to about 35% of a total lateral width of the connection block 130 in the second lateral direction (e.g., Y direction). In example embodiments, the extension length of the second hinge groove 220 in the second lateral direction (e.g., Y direction) may be in a range of about 20 mm to about 50 mm, a range of about 25 mm to about 45 mm, or a range of about 30 mm to about 40 mm.

In example embodiments, the extension length H2 of the second hinge groove 220 in the vertical direction (e.g., Z direction) may be in a range of about 30% to about 50% of a total vertical height of the connection block 130 in the vertical direction (e.g., Z direction). In example embodiments, the extension length H2 of the second hinge groove 220 in the vertical direction (e.g., Z direction) in the extension length H2 may be in a range of about 10 mm to about 25 mm, a range of about 12 mm to about 23 mm, or a range of about 15 mm to about 20 mm.

In a side cross-sectional view, the second hinge groove 220 may include a second lower groove 223 having a circular shape and the second upper groove 221, which linearly extends upward from the second lower groove 223 toward the upper surface 139U of the connection block 130. The second upper groove 221 may have a uniform lateral width and extend in the vertical direction (e.g., Z direction). A diameter D2 of the second lower groove 223 may be greater than a lateral width of the second upper groove 221 in the first lateral direction (e.g., X direction). For example, the diameter D2 of the second lower groove 223 may be in a range of about 150% to about 250% of the lateral width of the second upper groove 221 in the first lateral direction (e.g., X direction). Because the second upper groove 223 at an end portion of the second hinge groove 220 has a circular cross-section, stress concentration may be alleviated at the end portion of the second hinge groove 220.

The second hinge groove 220 may pass through the side portion 130S of the connection block 130 in the second lateral direction (e.g., Y direction). That is, one side end portion and another side end portion of the second hinge groove 220 in the second lateral direction (e.g., Y direction) may be exposed to the outside of the connection block 130. The side portion 130S of the connection block 130 may include a second front end portion 241 and a second rear end portion 243, which are spaced apart from each other in the first direction with the second hinge groove 220 therebetween. In this case, the second hinge groove 220 may be defined as a gap between the second front end portion 241 and the second rear end portion 243 of the connection block 130.

The second hinge groove 220 and the first hinge groove 210 may be spaced apart from each other. For example, a lower end portion of the second hinge groove 220 may be spaced apart from an upper end portion of the first hinge groove 210 in the vertical direction (e.g., Z direction) and/or the first lateral direction (e.g., X direction). To adjust a distance between the first hinge groove 210 and the second hinge groove 220, the first distance L1 between the first hinge groove 210 and the rear surface 119B of the seal plate 110, the second distance L2 between the second hinge groove 220 and the rear surface 119B of the seal plate 110, a length H1 of the first hinge groove 210 in the vertical direction (e.g., Z direction), and/or a length H2 of the second hinge groove 220 in the vertical direction (e.g., Z direction) may be adjusted. For example, the distance between the first hinge groove 210 and the second hinge groove 220 may be in a range of about 3 mm to about 9 mm.

Each of the two side portions 130S of the connection block 130 may be fastened to the seal plate 110 by at least one first fastening bolt 151 passing through the first hinge groove 210 and at least one second fastening bolt 153 passing through the second hinge groove 220. For example, each of the two side portions 130S of the connection block 130 may be fastened to the seal plate 110 by at least two first fastening bolts 151 passing through the first hinge groove 210 and at least two second fastening bolts 153 passing through the second hinge groove 220.

Each of the two side portions 130S of the connection block 130 may include a first bolt head receiving hole 131_1 and a first bolt body receiving hole 133_1. The first bolt head receiving hole 131_1 may extend from the rear surface 139B of the connection block 130 to the first hinge groove 210 in the first lateral direction (e.g., X direction). The first bolt body receiving hole 133_1 may extend from the front surface 139F of the connection block 130 to the first hinge groove 210 in the first lateral direction (e.g., X direction). The seal plate 110 may include a first fastening groove 111_1, which is aligned with the first bolt body receiving hole 133_1 in the first lateral direction (e.g., X direction).

The first bolt head receiving hole 131_1 may pass through the first rear end portion 233 of the connection block 130 in the first lateral direction (e.g., X direction) and accommodate a head of the first fastening bolt 151. The first bolt body receiving hole 133_1 may pass through the first front end portion 231 of the connection block 130 in the first lateral direction (e.g., X direction) and accommodate a body of the first fastening bolt 151, which extends from the head of the first fastening bolt 151. The body of the first fastening bolt 151 may be a shank that does not have threads. For example, the first fastening bolt 151 may further include a head and a screwed portion. The screwed portion may have threads. The shank may connect the head and the screwed portion with each other. A diameter of the first bolt body receiving hole 133_1 may be less than a diameter of the first bolt head receiving hole 131_1 and greater than a diameter of the body of the first fastening bolt 151. The first fastening groove 111_1 may extend from the rear surface 119B of the seal plate 110 in the first lateral direction (e.g., X direction), and may be provided with a screw thread that engages a screw thread provided on a screw of the first fastening bolt 151. The screw thread of the first fastening groove 111_1 may be formed on an inner circumferential surface of the first fastening groove 111_1. Because the screw thread of the first fastening bolt 151 engages the screw thread of the first fastening groove 111_1, the first front end portion 231 of the connection block 130 may be fastened and fixed to the seal plate 110.

Each of the two side portions 130S of the connection block 130 may include a second bolt head receiving hole 131_2 and a second bolt body receiving hole 133_2. The second bolt head receiving hole 131_2 may extend from the rear surface 139B of the connection block 130 to the second hinge groove 220 in the first lateral direction (e.g., X direction). The second bolt body receiving hole 133_2 may extend from the front surface 139F of the connection block 130 to the second hinge groove 220 in the first lateral direction (e.g., X direction). The seal plate 110 may include a second fastening groove 111_2, which is aligned with the second bolt body receiving hole 133_2 in the first lateral direction (e.g., X direction).

The second bolt head receiving hole 131_2 may pass through the second rear end portion 243 of the connection block 130 in the first lateral direction (e.g., X direction) and accommodate a head of the second fastening bolt 153. The second bolt body receiving hole 133_2 may pass through the second front end portion 241 of the connection block 130 in the first lateral direction (e.g., X direction) and accommodate a body of the second fastening bot 153, which extends from the head of the second fastening bolt 153. The body of the second fastening bolt 153 may be a shank that does not have threads. For example, the second fastening bolt 153 may further include a head and a screwed portion. The screwed portion may have threads. The shank may connect the head and the screwed portion with each other. A diameter of the second bolt body receiving hole 133_2 may be less than a diameter of the second bolt head receiving hole 131_2 and greater than a diameter of the body of the second fastening bolt 153. The second fastening groove 111_2 may extend from the rear surface 119B of the seal plate 110 in the first lateral direction (e.g., X direction), and may be provided with a screw thread that engages a screw thread provided on a screw of the second fastening bolt 153. The screw thread of the second fastening groove 111_2 may be formed on an inner circumferential surface of the second fastening groove 111_2. Because the screw thread of the second fastening bolt 153 engages the screw thread of the second fastening groove 111_2, the second front end portion 241 of the connection block 130 may be fastened and fixed to the seal plate 110.

The seal plate 110 and the connection block 130 may have structures aligned with each other in the first direction. In example embodiments, each of the two side portions 130S of the connection block 130 may include an alignment protrusion 137, which protrudes from the front surface 139F of the connection block 130 in the first direction, and an alignment groove 113 in which the alignment protrusion 137 may be provided at the rear surface 119B of the seal plate 110. Because the connection block 130 is aligned with the seal plate 110 by inserting the alignment protrusion 137 of the connection block 130 into the alignment groove 113 of the seal plate 110, an assembly process for connecting the connection block 130 to the seal plate 110 may be performed relatively easily. In example embodiments, to enable alignment between the seal plate 110 and the connection block 130, a groove may be provided at each of the two side portions 130S of the connection block 130, and the seal plate 110 may include protrusions that are inserted into the grooves provided at the two side portions 130S of the connection block 130.

When the opening 511 of the processing chamber 510 is closed using the valve structure 100 under the condition of a non-uniform surface pressure applied between the seal plate 110 and the wall surface of the processing chamber 510, such non-uniform surface pressure may be damaging to components included in the valve structure 100 (e.g., the deformation of the shaft 140 and/or the abrasion of the seal ring 120), the performance of the valve structure 100 may deteriorate, and the reliability of a substrate processing apparatus (refer to 1000 in FIG. 5) including the valve structure 100 may deteriorate.

According to example embodiments, because the driving force of the actuator 160, which is transmitted through the shaft 140, is applied to the seal plate 110 through the connection block 130, to which the flexure hinge structure is applied, a uniform surface pressure may be applied between the seal plate 110 and the wall surface of the processing chamber 510 via the flexure hinge structure at the side portions of the connection block 130. Accordingly, the reliability of the valve structure 100 and the reliability of the substrate processing apparatus 1000 including the valve structure 100 may be improved.

Figure 5:
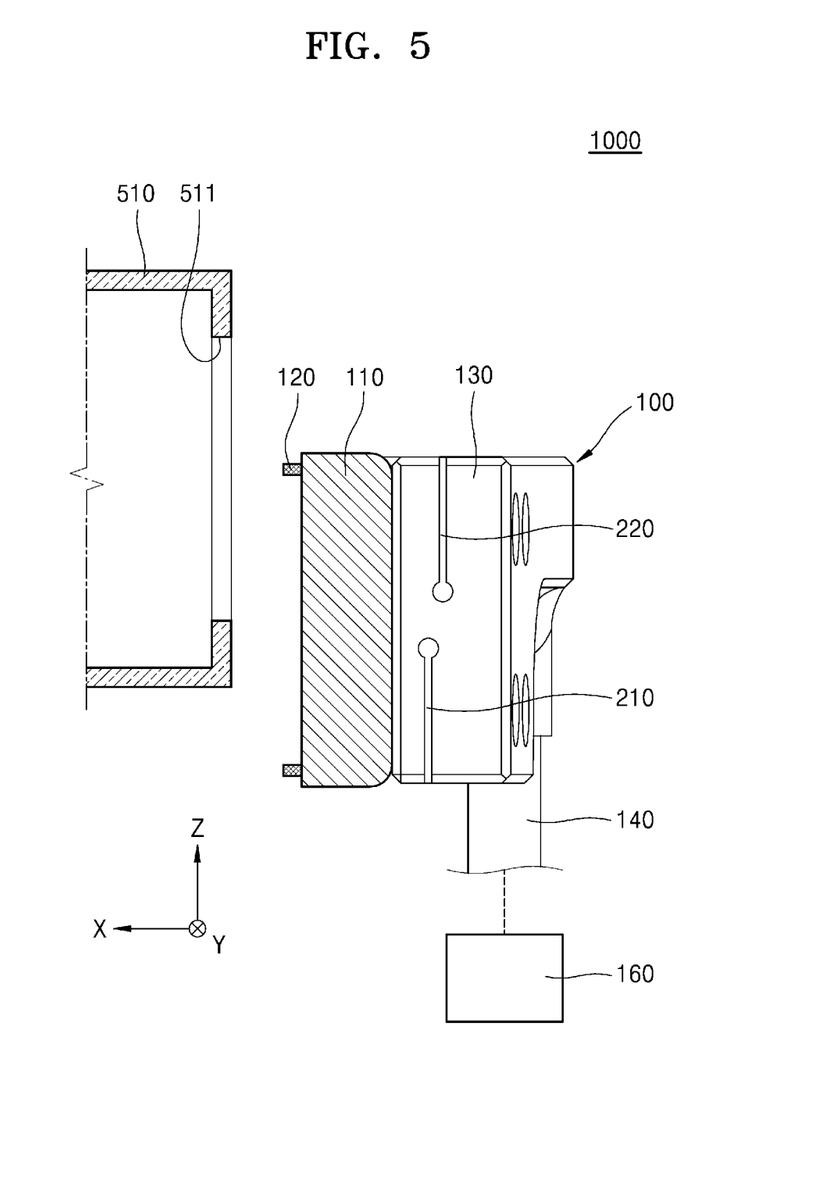
FIGS. 5 to 7 are construction views of a substrate processing apparatus including a valve structure, according to example embodiments.
Figure 6:
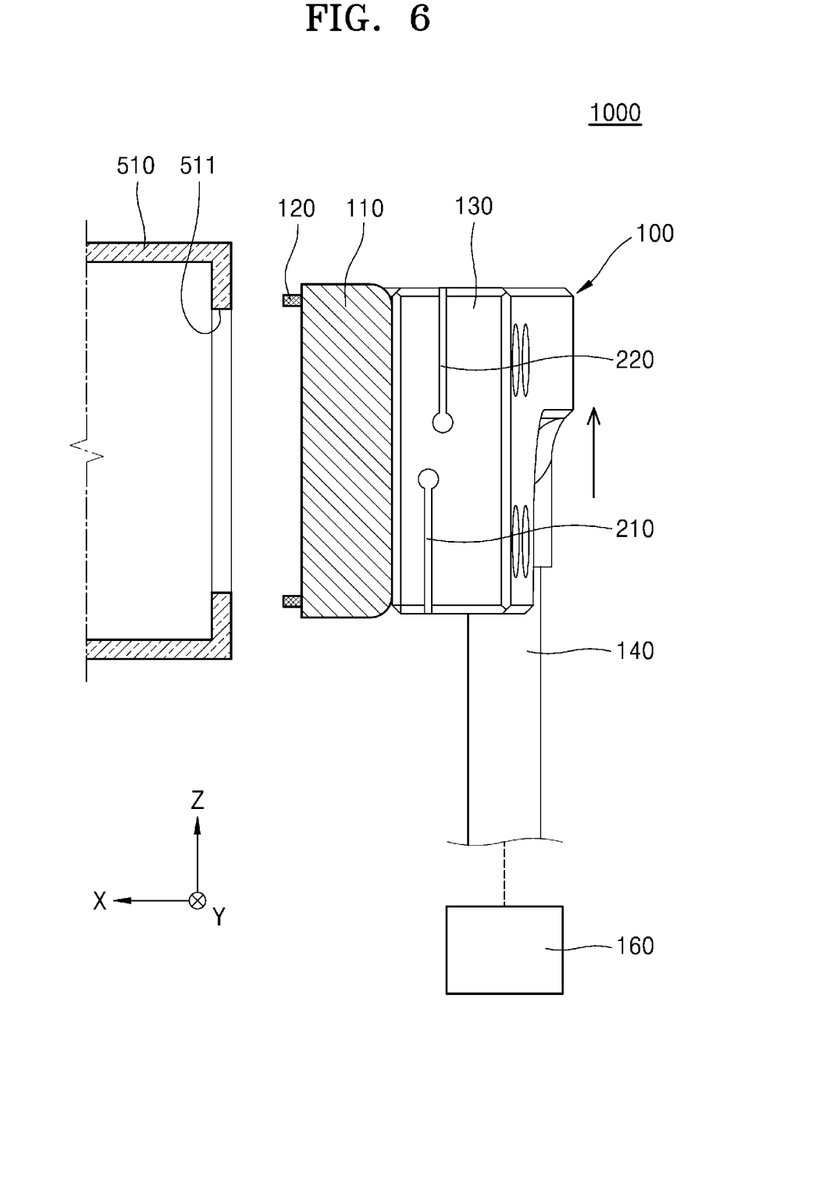
Figure 7:
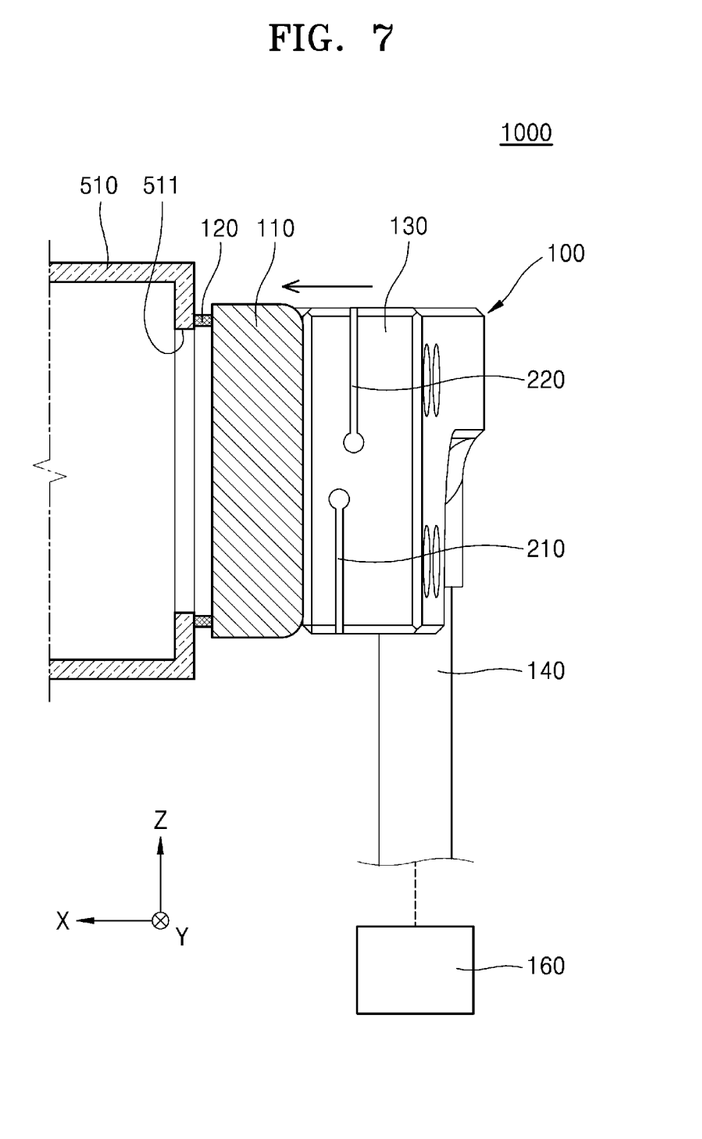

FIGS. 5 to 7 are construction views of a substrate processing apparatus 1000 including the valve structure 100 of FIG. 1, according to embodiments.

FIGS. 5 to 7 illustrate an operation of sequentially switching the valve structure 100 from an opening position to a closing position. Specifically, FIG. 5 illustrates the opening position of the valve structure 100, FIG. 6 illustrates an intermediate position of the valve structure 100, and FIG. 7 illustrates the closing position of the valve structure 100.

Referring to FIGS. 1 to 7, the substrate processing apparatus 1000 may include the processing chamber 510 and the valve structure 100 configured to open and close the opening 511 of the processing chamber 510. The valve structure 100 may switch between the opening position at which the opening 511 of the processing chamber 510 is opened and the closing position at which the opening 511 of the processing chamber 510 is closed.

The opening position of the valve structure 100 may be a position at which the opening 511 of the processing chamber 510 is opened so that a substrate may be loaded into and unloaded from the processing chamber 510 through the opening 511 of the processing chamber 510. When the valve structure 100 is at the opening position, the seal plate 110 may be at a position that is spaced apart from the opening 511 of the processing chamber 510 in the first lateral direction (e.g., X direction) and the vertical direction (e.g., Z direction).

The intermediate position of the valve structure 100 may be a position between the opening position and the closing position of the valve structure 100. When the valve structure 100 is at the intermediate position, the seal plate 110 may be positioned at a position that is spaced apart from the opening 511 of the processing chamber 510 in the first lateral direction (e.g., X direction). When the valve structure 100 switches from the opening position to the intermediate position, the actuator 160 may transmit driving force through the shaft 140 to the connection block 130 and move the connection block 130 and the seal plate 110 upward.

The closing position of the valve structure 100 may be a position at which the opening 511 of the processing chamber 510 is closed by the valve structure 100. When the valve structure 100 is at the closing position, the seal plate 110 or the seal ring 120 may contact the wall surface of the processing chamber 510 having the opening 511. When the valve structure 100 is at the closing position, a vacuum may be formed in an inner space of the processing chamber 510. When the valve structure 100 switches from the intermediate position to the closing position, the actuator 160 may transmit driving force through the shaft 140 to the connection block 130, the connection block 130 and the seal plate 110 may be moved in the first lateral direction (e.g., X direction).

The actuator 160 may move the connection block 130 and the seal plate 110 by using the shaft 140 in the first lateral direction (e.g., X direction) and the vertical direction (e.g., Z direction). The actuator 160 may move the connection block 130 and the seal plate 110 in the first lateral direction (e.g., X direction) and/or the vertical direction (e.g., Z direction) such that the valve structure 100 switches among the closing position, the intermediate position, and the opening position.

When the valve structure 100 is at the closing position, the actuator 160 may transmit driving force to the connection block 130 through the shaft 140 so that the seal plate 110 may contact the wall surface of the processing chamber 510 under an appropriate pressure. According to example embodiments, because the driving force of the actuator 160 is applied to the seal plate 110 through the connection block 130 having the flexure hinge structure, a uniform surface pressure may be applied between the seal plate 110 and the wall surface of the processing chamber 510. Accordingly, the reliability of the valve structure 100 and the reliability of the substrate processing apparatus 1000 including the valve structure 100 may be improved.

Figure 8:
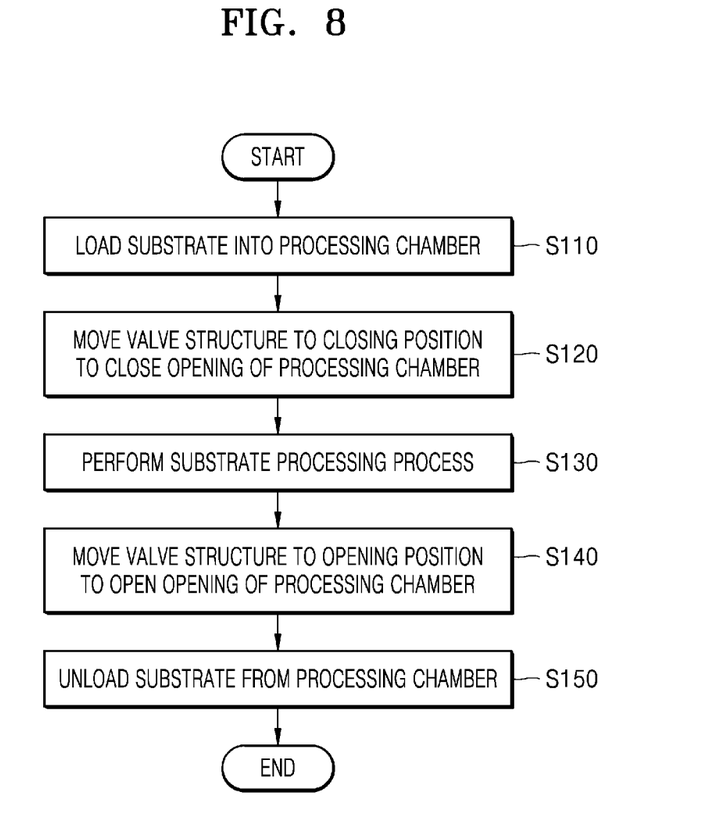
FIG. 8 is a flowchart of a method of processing a substrate, according to example embodiments.

FIG. 8 is a flowchart of a method of processing a substrate, according to example embodiments.

Hereinafter, a method of processing a substrate using the substrate processing apparatus 1000 will be described with reference to FIGS. 5 to 7 and 8.

To begin with, the valve structure 100 may be positioned at the opening position to open the opening 511 of the processing chamber 510, and a substrate to be processed may be loaded into the processing chamber 510 through the opening 511 of the processing chamber 510 (S110). The substrate may be mounted on a stage provided in the processing chamber 510.

After the substrate is loaded into the processing chamber 510, the valve structure 100 may be moved to the closing position to close the opening 511 of the processing chamber 510 (S120).

After the opening 511 of the processing chamber 510 is closed, a substrate processing process may be performed on the substrate (S130). For example, the substrate processing process may include a deposition process, an etching process, an oxidation process, a cleaning process, and the like. To perform the substrate processing process, the substrate processing apparatus 1000 may adjust pressure of an inner space of the processing chamber 510 to a vacuum or a predetermined level of pressure. For example, the substrate processing apparatus 1000 may adjust the pressure of the inner space of the processing chamber 510 to a pressure of about 10 Torr or less, $10^{-1}$ Torr or less, or $10^{-3}$ Torr or less. For example, the substrate processing apparatus 1000 may adjust the pressure of the inner space of the processing chamber 510 to a vacuum by using a vacuum pump configured to exhaust gas from the inner space of the processing chamber 510.

When the substrate processing process is completed, the valve structure 100 may be moved to the opening position to open the opening 511 of the processing chamber 510 (S140). Before the opening 511 of the processing chamber 510 is opened, the substrate processing apparatus 1000 may adjust the pressure of the inner space of the processing chamber 510 to an atmospheric pressure or an approximate level thereto by supplying a purge gas into the processing chamber 510. For example, the substrate processing apparatus 1000 may increase the pressure of the inner space of the processing chamber 510 by using a gas supply source configured to supply the purge gas (e.g., nitrogen gas, an inert gas, and/or clean dry air) to the inner space of the processing chamber 510.

After the opening 511 of the processing chamber 510 is opened, the substrate on which the substrate processing process has been completely performed may be unloaded from the processing chamber 510 through the opening 511 of the processing chamber 510 (S150).

According to example embodiments, because driving force of the actuator 160 is applied to the seal plate 110 through the connection block 130 having a flexure hinge structure, a uniform surface pressure may be applied between the seal plate 110 and the wall surface of the processing chamber 510. As a result, the sealing force of the processing chamber 510 may be improved, and thus, the reliability of the substrate processing process using the substrate processing apparatus 1000 may be improved.

While the inventive concept has been particularly shown and described with reference to embodiments thereof, it will be understood that various changes in form and details may be made therein without departing from the spirit and scope of the following claims.

What is claimed is:

1. A process chamber door for closing or opening an entrance of a process chamber through which a substrate to be processed is loaded, comprising:
 a seal plate comprising a front surface and a rear surface opposite to each other in a first direction;
 a connection block connected to the rear surface of the seal plate, the connection block comprising a central portion and two side portions connected to the rear surface of the seal plate; and
 a shaft connected to the central portion of the connection block,
 wherein the connection block further comprises:
 a first hinge groove disposed at a bottom surface and a side surface of each of the two side portions of the connection block, the first hinge groove extending in a second direction and a third direction in the connection block, wherein the second direction is perpendicular to the first direction, and the third direction is perpendicular to the first direction and the second direction; and
 a second hinge groove disposed at an upper surface and the side surface of each of the two side portions of the connection block, the second hinge groove extending in the second direction and the third direction.

2. The process chamber door of claim 1,
 wherein a width of the first hinge groove in the first direction is less than a length of the first hinge groove in the second direction and a length of the first hinge groove in the third direction, and
 wherein a width of the second hinge groove in the first direction is less than a length of the second hinge groove in the second direction and a length of the second hinge groove in the third direction.

3. The process chamber door of claim 2,
 wherein each of the first hinge groove and the second hinge groove has a width, in the first direction, between about 0.5 mm and about 3 mm, and
 wherein each of the first hinge groove and the second hinge groove has a length, in the third direction, between about 10 mm and about 25 mm.

4. The process chamber door of claim 1,
 wherein a first distance between the rear surface of the seal plate and the first hinge groove in the first direction is different from a second distance between the rear surface of the seal plate and the second hinge groove in the first direction.

5. The process chamber door of claim 1,
 wherein a first distance between the rear surface of the seal plate and the first hinge groove in the first direction is equal to a second distance between the rear surface of the seal plate and the second hinge groove in the first direction.

6. The process chamber door of claim 1,
 wherein the two side portions of the connection block are fastened to the seal plate, and
 wherein the central portion of the connection block is spaced apart from the rear surface of the seal plate.

7. The process chamber door of claim 1,
 wherein, in a side cross-sectional view, the first hinge groove comprises a first upper groove having a circular shape and a first lower groove linearly extending from the first upper groove to the bottom surface of the connection block in the third direction, and
 wherein in a side cross-sectional view, the second hinge groove comprises a second lower groove having a circular shape and a second upper groove linearly extending from the second lower groove to the upper surface of the connection block in the third direction.

8. The process chamber door of claim 7,
 wherein a diameter of the circular shape of the first upper groove is greater than a width of the first lower groove in the first direction, and
 wherein a diameter of the circular shape of the second lower groove is greater than a width of the second upper groove in the first direction.

9. The process chamber door of claim 1,
 wherein each of the two side portions of the connection block is fastened to the seal plate by at least one fastening bolt.

10. The process chamber door of claim 1,
 wherein each of the two side portions of the connection block is fastened to the seal plate by a first fastening bolt passing through the first hinge groove and a second fastening bolt passing through the second hinge groove,
 wherein the connection block further comprises:
 a first bolt head receiving hole extending from a rear surface of the connection block to the first hinge groove in the first direction, the first bolt head receiving hole being configured to accommodate a head of the first fastening bolt;
 a first bolt body receiving hole extending from a front surface of the connection block to the first hinge groove in the first direction, the first bolt body receiving hole being configured to accommodate a body of the first fastening bolt;
 a second bolt head receiving hole extending from the rear surface of the connection block to the second hinge groove in the first direction, the second bolt head receiving hole being configured to accommodate a head of the second fastening bolt; and
 a second bolt body receiving hole extending from the front surface of the connection block to the second hinge groove in the first direction, the second bolt body receiving hole being configured to accommodate a body of the second fastening bolt, wherein the seal plate comprises:
a first fastening groove aligned with the first bolt body receiving hole in the first direction, the first fastening groove having a screw thread configured to engage a screw thread of the first fastening bolt; and
a second fastening groove aligned with the second bolt body receiving hole in the first direction, the second fastening groove having a screw thread configured to engage a screw thread of the second fastening bolt.

11. The process chamber door of claim 1,
wherein each of the two side portions of the connection block comprises an alignment protrusion, and
wherein the seal plate comprises an alignment groove into which the alignment protrusion is inserted.

12. The process chamber door of claim 1,
wherein the connection block and the seal plate are moved by the shaft in at least one of the first direction and the third direction.

13. The process chamber door of claim 12,
wherein the shaft extends along a straight line extending in the third direction, and
wherein the connection block comprises a shaft insertion hole into which the shaft is inserted.

14. A process chamber door for closing or opening an entrance of a process chamber through which a substrate to be processed is loaded, comprising:
a seal plate comprising a front surface and a rear surface opposite to each other in a first direction;
a connection block connected to the rear surface of the seal plate, the connection block comprising a central portion and two side portions connected to the rear surface of the seal plate; and
a shaft connected to the central portion of the connection block, the shaft being configured to be moved by an actuator,
wherein the connection block further comprises:
a first hinge groove disposed at a bottom surface and a side surface of each of the two side portions of the connection block, the first hinge groove extending in a second direction and a third direction in the connection block, wherein the second direction is perpendicular to the first direction and the third direction is perpendicular to the first direction and the second direction;
a second hinge groove disposed at an upper surface and the side surface of each of the two side portions of the connection block, the second hinge groove extending in the second direction and the third direction in the connection block and being spaced apart from the first hinge groove in the third direction;
a first front end portion and a first rear end portion spaced apart from each other with the first hinge groove therebetween; and
a second front end portion and a second rear end portion spaced apart from each other with the second hinge groove therebetween,
wherein the first front end portion of the connection block is fastened to the seal plate by a first fastening bolt, and
wherein the second front end portion of the connection block is fastened to the seal plate by a second fastening bolt.

15. The process chamber door of claim 14,
wherein two end portions, in the second direction, of the first hinge groove are exposed to the outside, and
wherein two end portions, in the second direction, of the second hinge groove are exposed to the outside.

16. The process chamber door of claim 14,
wherein the connection block is provided with a first notch and a second notch, wherein the first notch is disposed between a first side portion of the two side portions and the central portion, and
wherein the second notch is disposed between a second portion of the two side portions and the central portion.

17. The process chamber door of claim 16,
wherein the second hinge groove extends along an upper surface of the first side portion in the second direction and is connected to the first notch.

18. The process chamber door of claim 14,
wherein each of the two side portions includes a portion protruding downwardly beyond a bottom surface of the central portion, and
wherein the first hinge groove extends, in the second direction, along a bottom surface of the portion protruding downwardly.

19. The process chamber door of claim 14,
wherein a width of the first hinge groove in the first direction is less than a length of the first hinge groove in the third direction,
wherein a width of the second hinge groove in the first direction is less than a length of the second hinge groove in the third direction,
wherein each of the first hinge groove and the second hinge groove has a width, in the first direction, between about 0.5 mm and about 3 mm, and
wherein each of the first hinge groove and the second hinge groove has a length, in the third direction, between about 10 mm and about 25 mm.

20. A substrate processing apparatus comprising:
a processing chamber comprising an entrance through which a substrate to be processed is loaded; and
a process chamber door configured to open or close the entrance of the processing chamber,
wherein the process chamber door comprises:
a seal plate comprising a front surface facing the processing chamber and a rear surface opposite to the front surface in a first lateral direction;
a connection block connected to the rear surface of the seal plate, the connection block comprising two side portions connected to the rear surface of the seal plate and a central portion between the two side portions; and
a shaft connected to the central portion of the connection block, the shaft being configured to be moved by an actuator in at least one of the first lateral direction and a vertical direction,
wherein the connection block further comprises:
a first hinge groove disposed at a bottom surface and a side surface of each of the two side portions of the connection block, the first hinge groove extending in the vertical direction and a second lateral direction in the connection block, wherein the second lateral direction is perpendicular to the first lateral direction; and
a second hinge structure disposed at an upper surface and the side surface of each of the two side portions of the connection block, the second hinge structure extending in the vertical direction and the second lateral direction.

* * * * *